United States Patent [19]

Pool

[11] Patent Number: 5,132,195
[45] Date of Patent: Jul. 21, 1992

[54] METHOD OF FABRICATING IMAGING APPARATUS

[75] Inventor: Peter J. Pool, Maldon, United Kingdom

[73] Assignee: EEV Limited, Chelmsford, United Kingdom

[21] Appl. No.: 752,930

[22] Filed: Aug. 30, 1991

Related U.S. Application Data

[63] Continuation of Ser. No. 307,458, Feb. 8, 1989, abandoned.

[30] Foreign Application Priority Data

Feb. 11, 1988 [GB] United Kingdom ............... 8803171

[51] Int. Cl.$^5$ .................................................. G03F 9/00
[52] U.S. Cl. ......................................... 430/22; 356/401; 355/77; 430/321; 430/394
[58] Field of Search ................. 430/22, 321, 394; 356/401; 355/77

[56] References Cited

U.S. PATENT DOCUMENTS

| | | | |
|---|---|---|---|
| 4,423,127 | 12/1983 | Fujimura | 430/22 |
| 4,488,806 | 12/1984 | Takahashi et al. | 355/77 |
| 4,613,230 | 1/1985 | Iwai | 355/53 |
| 4,748,478 | 5/1988 | Suwa et al. | 355/53 |
| 4,856,037 | 8/1989 | Mueller et al. | 378/34 |
| 4,883,359 | 11/1989 | Ina et al. | 356/401 |
| 4,980,718 | 12/1990 | Salter et al. | 355/77 |

FOREIGN PATENT DOCUMENTS

| | | |
|---|---|---|
| 0017759 | 10/1980 | European Pat. Off. |
| 0035113 | 9/1981 | European Pat. Off. |
| 0138602 | 4/1985 | European Pat. Off. |
| 0189869 | 8/1986 | European Pat. Off. |
| 2052767 | 1/1981 | United Kingdom |
| 2148017 | 5/1985 | United Kingdom |

OTHER PUBLICATIONS

IBM Technical Disclosure Bulletin, "Use of Marks Formed in Resist to Verify E-Beam to Optical Mark Placement", W. J. Bently et al, vol. 24, No. 9, Feb. 1982, pp. 4754-4755.

IBM Technical Disclosure Bulletin, "Mask for Producing a Pattern of Fiducial Points on Semiconductor Wafers", J. F. Wuestenhagen, vol. 16, No. 7, Dec. 1973, pp. 2306-2307.

Optical Engineering, "Large Format, High Resolution Image Sensors", M. M. Blouke et al, Sep., 1987, vol. 26, No. 9, pp. 837-843.

Primary Examiner—Richard L. Schilling
Assistant Examiner—Thomas R. Neville
Attorney, Agent, or Firm—Spencer, Frank & Schneider

[57] ABSTRACT

In a method for fabricating imaging apparatus, adjoining regions, each forming only part of the active area of the complete device, are laid down separately, enabling larger active areas to be produced than would otherwise be possible using conventional wafer stepper equipment. In the complete device, imaging may be arranged over the boundary between the regions and/or charge may be transferred across the boundary.

41 Claims, 9 Drawing Sheets

METHOD OF FABRICATING IMAGING APPARATUS

This application is a continuation of application Ser. No. 07/307,458, Filed Feb. 8th, 1989, now abandoned.

FIELD OF THE INVENTION

This invention relates to imaging apparatus and is particularly applicable to imaging apparatus having a relatively large image area.

BACKGROUND TO THE INVENTION

Generally, in solid state imaging devices, a two-dimensional electrical charge pattern is generated at an image area by an incident light image, the amount of charge accumulated at each picture point (pixel) of the image area being proportional to the light intensity at that point. After a fixed period of charge integration, the accumulated charge is read-out, pixel by pixel, into a video amplifier to give a time sequential analogue signal which is representative of the viewed scene.

There are several different types of solid state imaging device available such as, for example, charge transfer devices with frame transfer or interline transfer architectures, or X-Y addressed charge injection or MOS array types. The present invention is relevant to all such types of device.

Modern photolithographic manufacturing equipments used for the fabrication of solid state imaging devices are of the "wafer stepper" type. These employ step and repeat technique to produce an array of patterns on a wafer substrate. The image field of a stepper is imaged onto a small area of the wafer and the wafer then moved and re-exposed. This process is repeated successively until the whole wafer has been covered with an array of patterns.

A disadvantage of the wafer stepper technique compared to the "whole wafer" aligners previously used, is that the size of the largest device that can be fabricated is limited by the optical field size of the wafer stepper. For many applications, such as astronomy and X-ray imaging, there is a need for larger devices than can be fabricated on currently available wafer steppers.

SUMMARY OF THE INVENTION

The present invention arose in an attempt to provide an improved method of fabricating an imaging device and improved imaging apparatus.

According to a first aspect of the invention there is provided a method for fabricating a solid state imaging device comprising the steps of: producing a first region on a substrate and separately producing a second region adjoining the first, each region forming only part of the active area of the complete device. The active area of an imaging device comprises the image area and/or store area. By employing a method in accordance with the invention, particularly large image areas may be fabricated using conventional wafer stepper equipment. Charge may be transferred across the boundary between the two regions. It is also possible to locate the boundary in an image area and image across it. Although the method may be applied to the fabrication of only two adjoining regions on the substrate, in practice, it is more usually used to produce a larger number of regions distributed over a substantial part of the substrate. The method may be used in the manufacture of analogue or digital imaging devices.

The method is particularly advantageously employed where the first and second regions are formed using photolithography.

In a preferred method in accordance with the invention, the steps are included of: producing a registration pattern including an alignment mark on the substrate prior to production of the regions; producing the first and second regions by exposing first and second fields respectively on the substrate, the first field comprising the first region and an alignment mark and the second field comprising the second field and an alignment mark; and positioning the regions on the substrate by an alignment process which includes bringing the alignment mark of the first or second field into registration with the alignment mark of the registration pattern. The registration pattern may be blank apart from the alignment mark, which conveniently is a cross. Usually, the image area of a device consists of a plurality of layers laid down one on top of another. In such a case, it is preferred that the alignment marks of the registration pattern and the first and second fields are additional to those used for normal layer-to-layer alignment. Preferably, two registration patterns, each including an alignment mark and which may be identical, are produced on the substrate and the alignment mark of the first field is aligned with the alignment mark of one of the registration patterns and that of the other field with the alignment mark of the other registration pattern. However, only one registration pattern may be used to produce the alignment of both the first and second fields.

It is preferred that the alignment is made to the latent image of the alignment mark of the registration pattern, reducing the number of processing stages required. Advantageously, the first and/or second field is moved relative to the substrate by a predetermined distance after alignment and then exposed to produce the region. This enables alignment marks to be preserved during exposure, thereby permitting them to be used in the alignment of subsequent layers. This enables a reduced number of alignment marks to be used and hence permits more of the image field to be made available for device structure. If the fields are exposed in an aligned position, the marks which are in registration become distorted and are not suitable for further use in aligning subsequent overlaid layers.

In an alternative method in accordance with the invention, the steps are included of: producing the first region by exposing a first field on the substrate, the first field comprising the first region and an alignment mark; bringing an alignment mark of a second field into registration with the first alignment mark formed on the substrate; and exposing the second field to produce the second region adjoining the first region. It is preferred that the second field is moved relative to the substrate by a predetermined distance after registration and before the second field is exposed, enabling alignment marks to be preserved for the positioning of subsequent layers.

In one method in accordance with the invention, the regions are substantially rectangular having long and short sides and may be arranged such that a long side of one regions adjoins a long side of the other. Alternatively, short sides of the regions may be adjoining, enabling long strip-like devices to be fabricated. Generally, two alignment marks are included in a field to enable the rotational alignment of the substrate to be established. The boundary between the regions may be substantially orthogonal or parallel to the line joining these two rotational alignment marks.

It may be preferred that the step is included of exposing a field on a substrate to produce a region which includes an end portion of the active area. The adjoining regions may thus both include end portions and be produced by the same field. However, where larger active areas are required, it is preferred that the step is included of exposing a second field on the substrate to produce another region which forms a middle portion of the active area. If larger active areas are required, a plurality of such middle portions are included between the end portions.

Where the active area comprises a plurality of layers, it is preferred that each layer comprises at least two adjoining regions which are separately fabricated and wherein the boundary between regions in one layer is offset from that in another layer. It is preferred that the boundary between the adjoining regions is parallel to the direction of charge transfer through the active area in the complete device although the direction of read-out may be made orthogonal to the boundary between the regions. In the latter case, where charge is read-out from the active area along a plurality of paths, it can be arranged that each path crosses the boundary thereby ensuring it has a substantially uniform effect on charge from different parts of the active area.

According to a second aspect of the invention, there is provided imaging apparatus having an active area which comprises at least two adjoing regions which are separately fabricated. It is preferred that the boundary between the regions is included in the active area, ensuring that the area can be utilised to its fullest extent. The adjoining regions may be fabricated so as to lie adjacent to one another, but they could be arranged to overlap to ensure good continuity between the two regions.

Imaging apparatus in accordance with the invention is particularly advantageously employed for astronomical observations where a large imaging area is required to obtain good results.

BRIEF DESCRIPTION OF THE DRAWINGS

Some ways in which the invention may be preformed are now described by way of example, with reference to the accompanying drawings in which.

DESCRIPTION OF PREFERRED METHODS AND EMBODIMENTS

These methods may be carried out using equipment manufactured by Ultratech Stepper Inc.

In a method of fabricating an active area in accordance with the invention, initially a plurality of registration patterns are laid down over the surface of a substrate or wafer using photolithography. Adjoining regions are then laid down on top of the registration patterns to form the large area devices.

Figure 1:
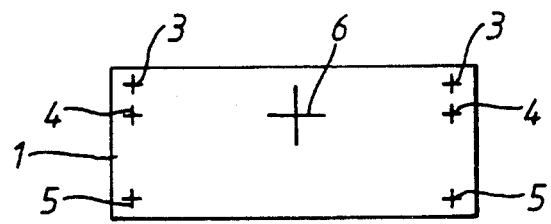
FIGS. 1 to 7 illustrate one method in accordance with the invention.
Figure 2:
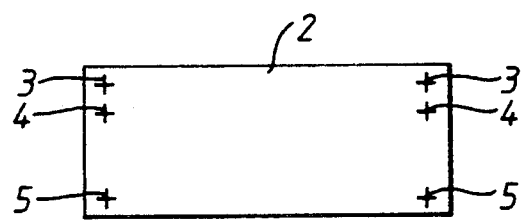

FIGS. 1 and 2 illustrate first and second image fields 1 and 2 respectively which are exposed on the wafer to produce the registration patterns. The two fields 1 and 2 are rectangular and each includes a plurality of alignment marks distributed along its short sides. In this particular method, each field includes three pairs of alignment crosses 3, 4 and 5, the first two pairs of marks 3 and 4 being located at the top of the image fields as shown and the other at the bottom. The second image field 2 is blank apart from these three pairs of alignment marks and the first image field 1 also includes a larger cross 6, known as an OAT which facilitates the machine acquisition of the alignment marks.

Figure 3:
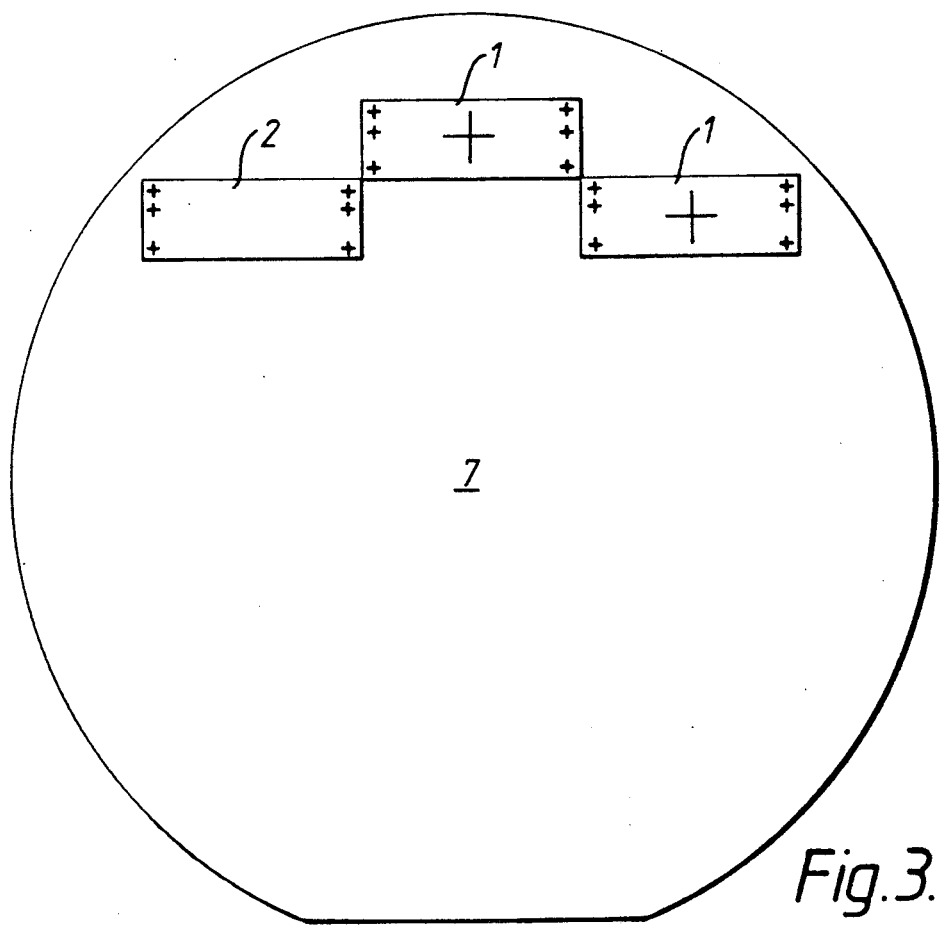

The first field 1 is exposed at least once on the substrate, usually near the edge of the wafer opposite its major flat. Conveniently, three exposures are made to produce the initial layout as illustrated in FIG. 3.

Figure 4:
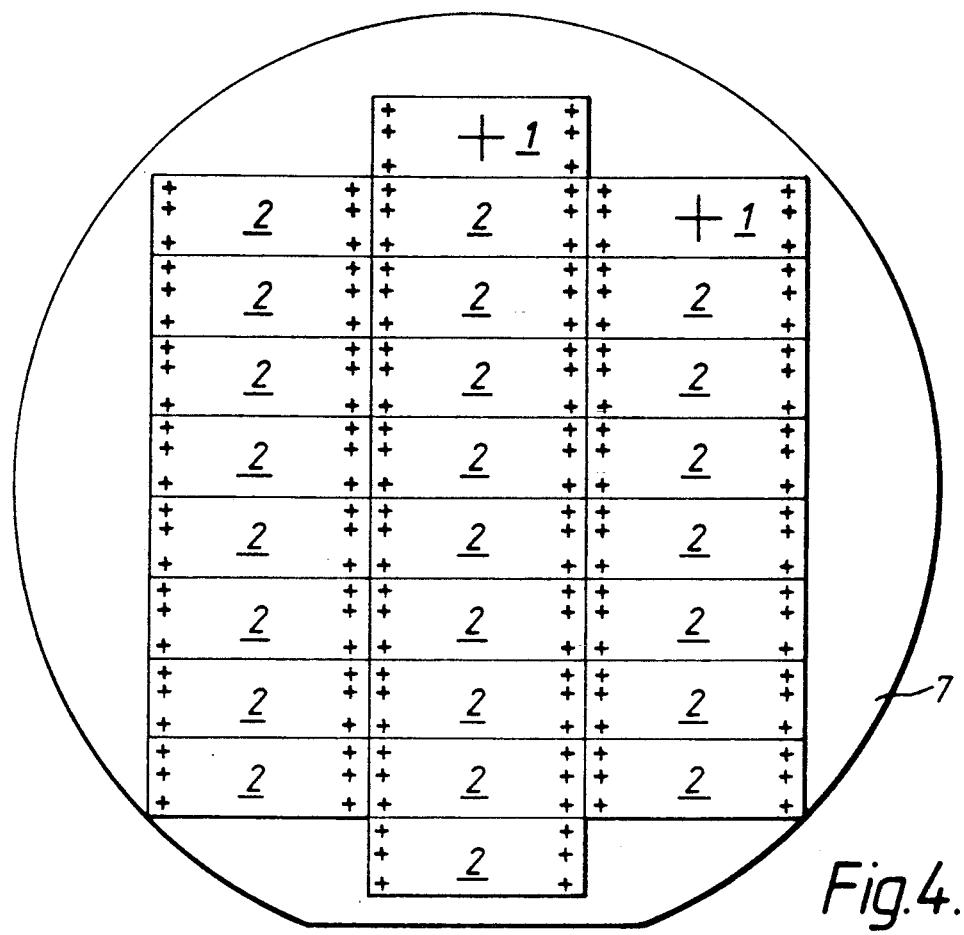

In a separate operation, the second field 2 is then aligned and exposed a number of times, the wafer being moved between each exposure, to produce an array of registration patterns covering a large area of the wafer as illustrated in FIG. 4.

Alignment is produced by bringing the crosses 3 in one field into registration with the crosses 5 in an adjacent field. In this method, the image is heavily exposed in a layer of positive photo-resist on the wafer, and alignment is achieved by aligning to the latent image of the alignment marks.

Figure 5:
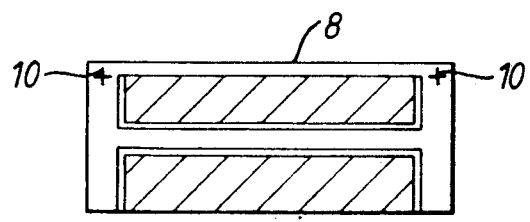
Figure 6:
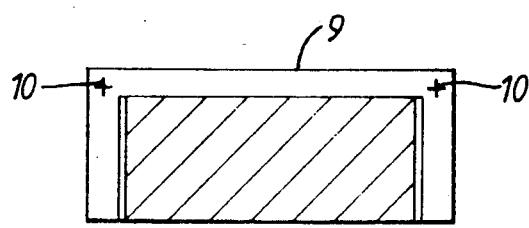

After the registration patterns have been laid down on the wafer, fields containing device structure are then laid down. Two such fields are illustrated in FIGS. 5 and 6. The field illustrated in FIG. 5 is a termination field 8 which includes the end portion of an image area. The field shown in FIG. 6 comprises a middle field 9. Both fields 8 and 9 include a pair of alignment marks 10 located at the top of the field as illustrated. The shaded portions of FIGS. 5 and 6 show active device regions and those edges shown as a double line indicate terminated device edges. The single line boundaries of the active device regions indicate unterminated device structure.

The fields 8 and 9 are aligned by bringing the alignment marks 10 into registration with the alignment marks 4 of the registration patterns laid down using fields 1 and 2. After alignment, the wafer is moved through a predetermined distance, for example 200 microns, and the fields 8 and 9 exposed. This prevents distortion of the alignment marks 4 and permits them to be used again in aligning subsequent layers.

Figure 7:
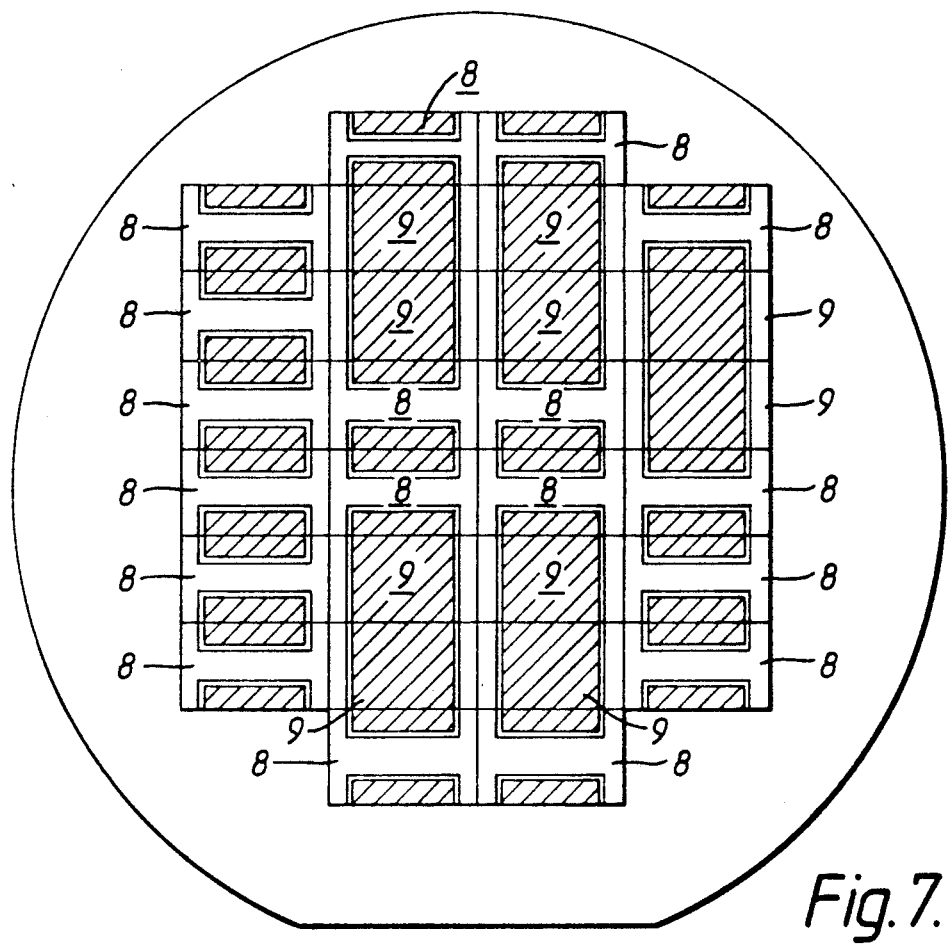

Termination fields 8 and middle fields 9 may be laid down in a variety of configurations to give devices of varying size, the final layout on the wafer being illustrated in FIG. 7 in which it can be seen that the rectangular fields are arranged to adjoin adjacent ones along with their long sides.

Figure 8:
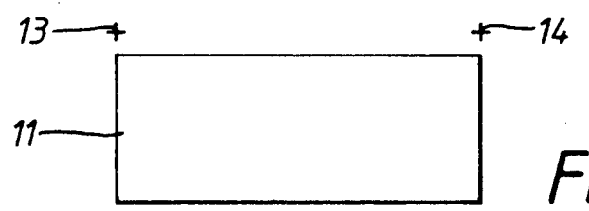
FIGS. 8 to 14 schematically illustrate another method in accordance with the invention.
Figure 9:
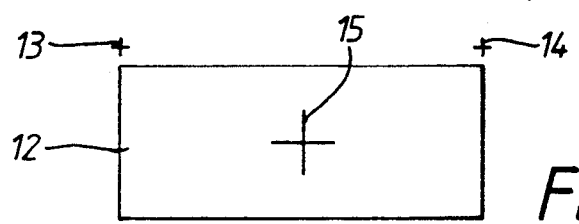

In another method in accordance with the invention, the image fields again are generally rectangular in shape and are arranged to be joined along their short sides. In this method, as in the previously described one, an array of registration patterns is initially laid down over the wafer area. First and second registration pattern fields 11 and 12 shown in FIGS. 8 and 9 both include two alignment crosses 13 and 14 arranged along their long sides and, in addition, the second field 12 also includes an OAT 15.

Figure 10:
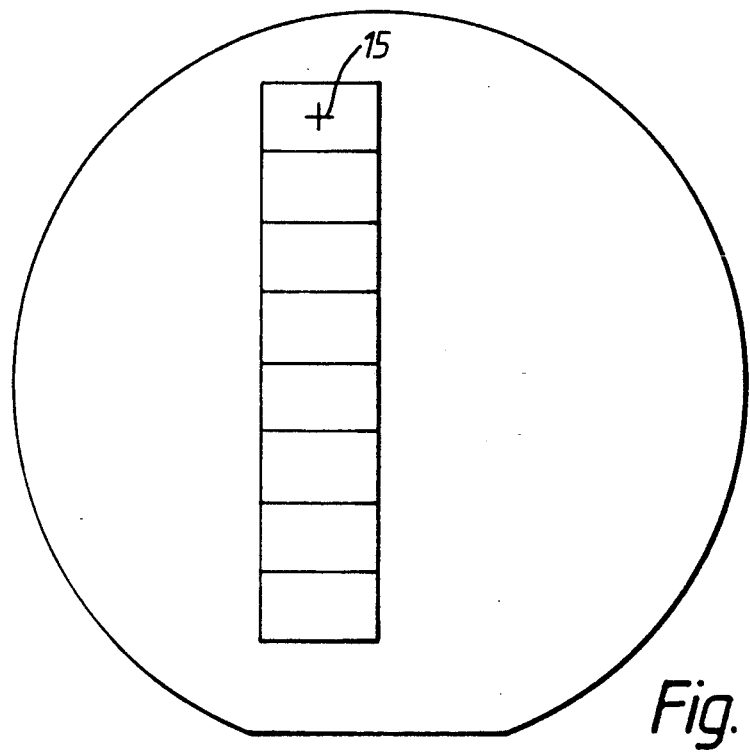

Initially, a number of fields are exposed on the substrate to give a distribution as illustrated in FIG. 10. At least one of the fields is that including an OAT 15.

Figure 11:
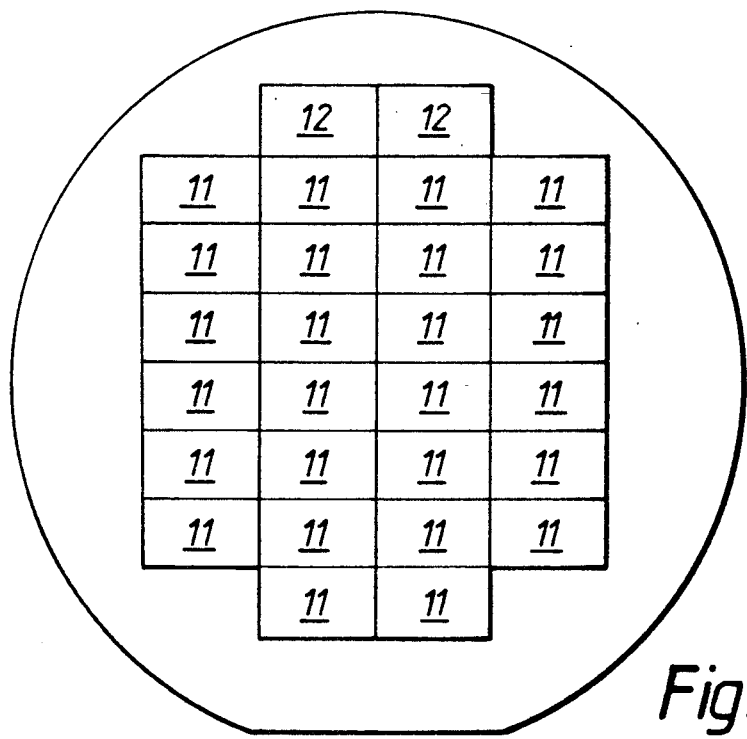

In a separate operation, the first field 11 is aligned and exposed a number of times to produce an array as illustrated in FIG. 11.

During the alignment process, initially the first field 11 is overlaid on the second field 12 with crosses 13 aligning to each other and the other alignment marks 14 being brought into registration. By aligning to both crosses, rotational alignment is ensured. All subsequent movements of the stepper to move the wafer are orthogonal, so retaining rotational aignment during subsequent steps in the process. Subsequent alignment takes place between the cross 13 of one field and cross 14 of the adjacent field.

Figure 12:
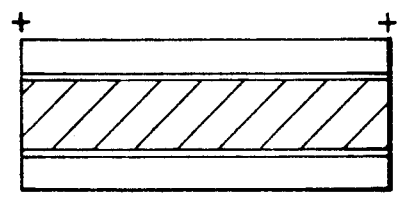
Figure 13:
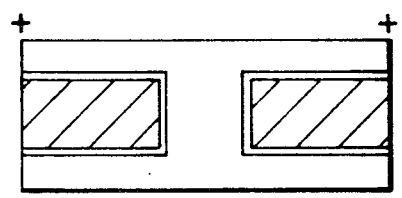
Figure 14:
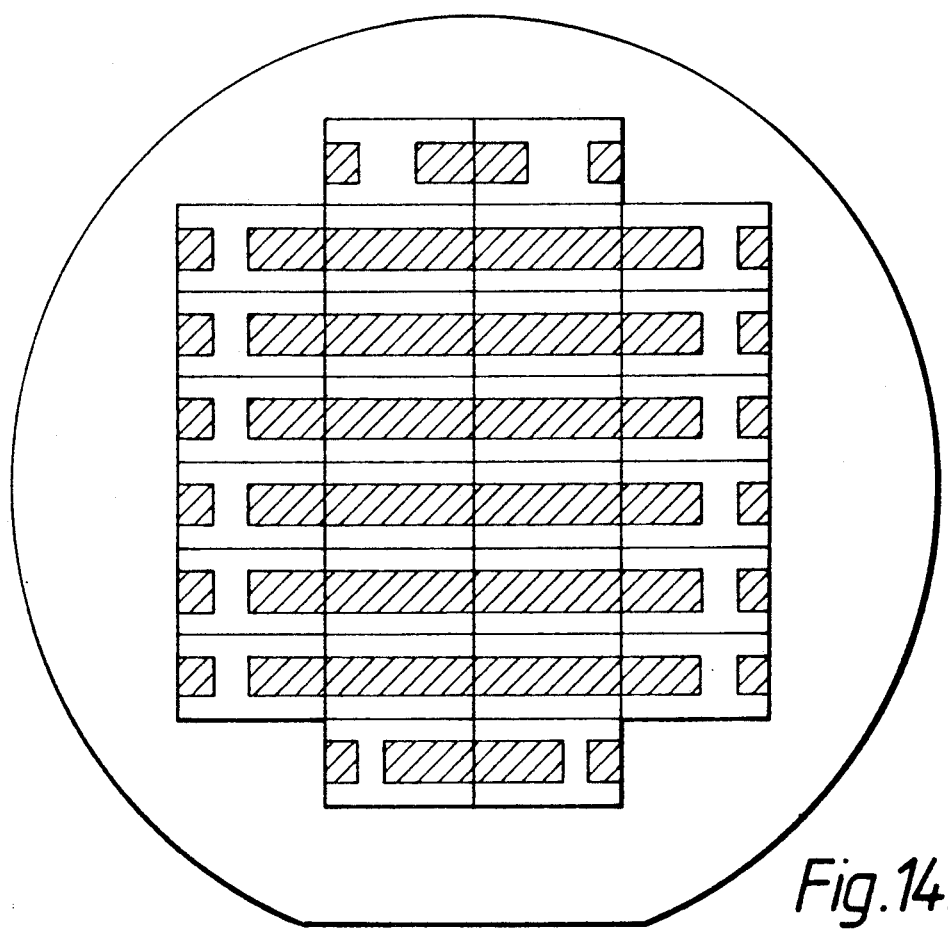

By using this method, very long devices may be fabricated by aligning and exposing fields containing device structure using the registration patterns set down. FIGS. 12 and 13 illustrate fields containing device structure in which FIG. 12 illustrates a middle portion and FIG. 13 a termination portion. The active device areas again are indicated by shading and the double lines indicate terminated device edges. FIG. 14 illustrates the array produced after the device-containing fields have been laid down.

With reference to FIGS. 15 to 21, another method in accordance with the invention is described which does not involve the initial fabrication of registration patterns. In this method the initial layer laid down on the substrate includes both active device regions and alignment marks.

Figure 15:
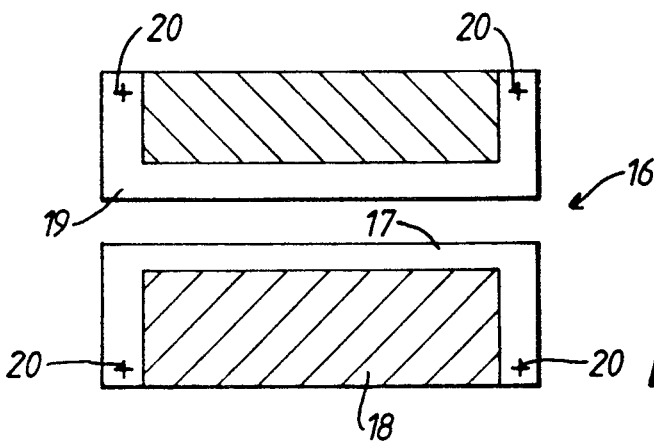
FIGS. 15 to 18 illustrate yet another method and imaging apparatus in accordance with the invention.
Figure 16:
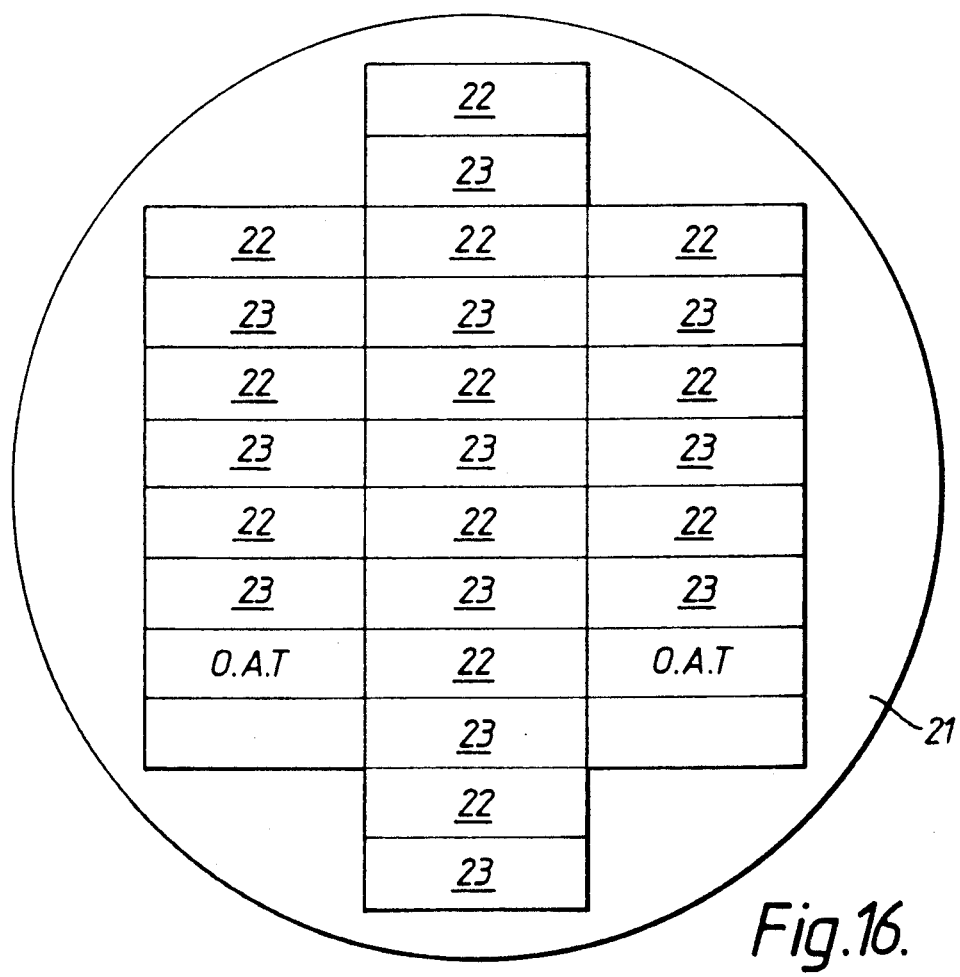

FIG. 15 shows a first image field 16 of 30×10 mm. The field 16 comprises an edge termination part 17 and a region 18 which is to form part of the active area. It also includes another portion 19 which may be arranged to form the edge termination of another imaging area. Four alignment crosses 20, which are 200 microns in size, are located to the sides of the region 18. The field 16 is projected onto a wafer 21 and aligned with an OAT as shown in FIG. 16. It is then exposed to photolithographically produce an image. The wafer 21 is moved a predetermined distance and the field 16 exposed again. The process is repeated to generate an array of images 22 covering the wafer 21.

Figure 17:
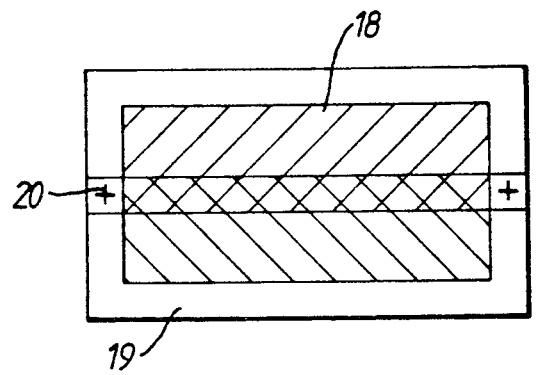

The field 16 is then realigned so as to bring the edge termination part 19 adjacent the region 18 of a previously laid down image. The crosses 20 at the top of the field 16 are aligned with the bottom crosses 20 of the image already fabricated, as shown in FIG. 17. The field 16 is then moved a fixed predetermined distance to bring the image 22 and the termination part 19 into the correct relationship, there being a slight overlap between the two. The wafer 21 is stepped and an array of second images 23 produced adjoining the first array of images 22.

Figure 18:
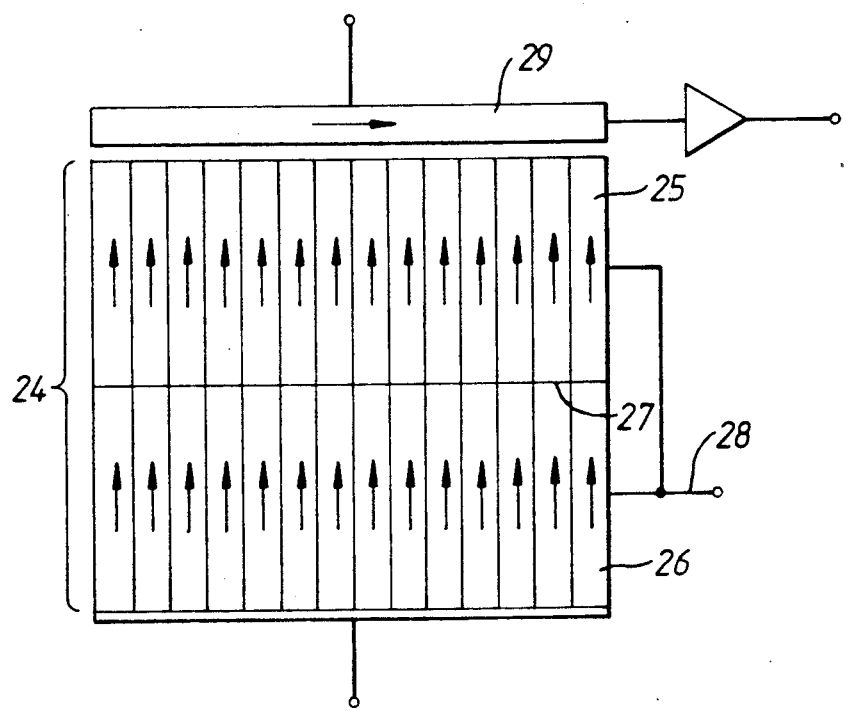

FIG. 18 illustrates imaging apparatus in accordance with the invention using an imaging area fabricated using the method described above. The apparatus includes an imaging area 24 which is formed of two regions 25 and 26 which adjoin each other at a boundary 27 between them. During operation of the apparatus, charge accumulates over the imaging area 24 in a distribution representative of the intensity of incident radiation. When it is wished to read out the accumulated charge, appropriate control signals are applied to electrodes 28 to read the charge into a read-out register 29 in the direction shown by the arrows. It should be noted that the charge is read out in paths which are generally orthogonal to the boundary 27 so that each path tends to be affected in the same way by its presence. Although the illustrated apparatus is of the analogue type, the invention may also be used in digital devices.

In another method in accordance with the invention, two different fields are used to produce the final imaging area. The first field 30 shown in FIG. 19 includes an active imaging region 31 and an edge termination 32, with bond pads 33 located between them. The second field 34 shown in FIG. 20 has a region 35 which forms part of the imaging area and does not include an edge termination part. In this method, the fields 30 and 34 are stitched together to form a large imaging area as shown in FIG. 21. It can be seen that it is fabricated in four stages, with the first field 30 being used to form the end portions of the device and two of the middle portions being formed using the second field 34.

Figure 19:
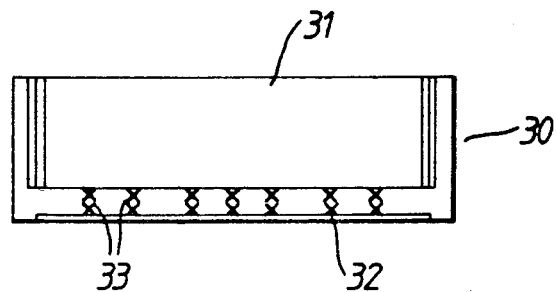
FIGS. 19 to 22 schematically show a further method and imaging apparatus in accordance with the invention.
Figure 20:
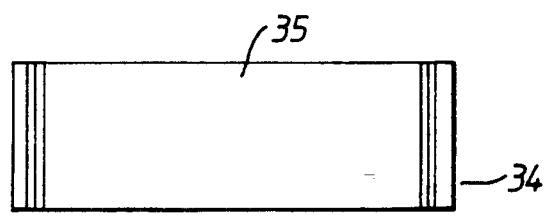
Figure 21:
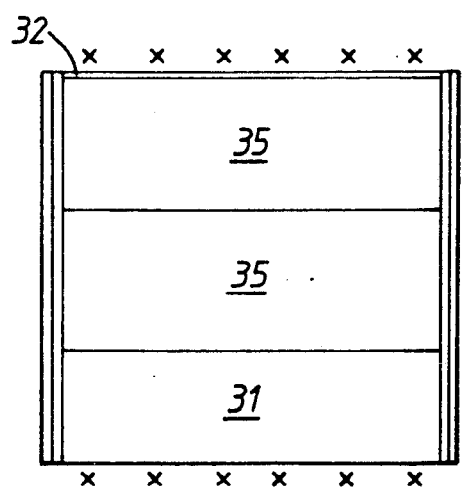
Figure 22:
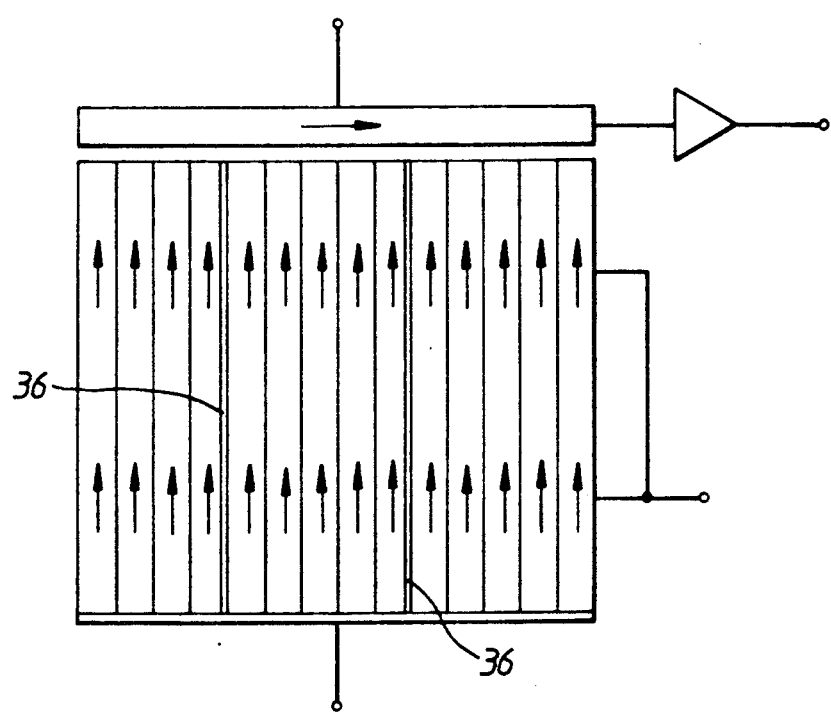

FIG. 22 schematically illustrates apparatus in accordance with the invention in which the imaging area is produced using the method described in relation to FIGS. 19, 20 and 21 and in which the charge is read out in the direction shown by the arrows parallel to the boundaries 36 between adjoining regions.

I claim:

1. In a method for fabricating a solid state imaging device including the steps of: photolithographically producing a first region on a substrate and separately producing a second region adjoining the first, with each region forming only part of the active area of the complete device; the improvement comprising: producing the first region by exposing a first field on the substrate, the first field comprising the first region and an alignment mark; bringing an alignment mark of a second field into registration with the first alignment mark formed on the substrate; and exposing the second field to produce the second region adjoining the first region.

2. A method as claimed in claim 1 wherein the second field is moved relative to the substrate by a predetermined distance after alignment before the second field is exposed.

3. A method as claimed in claim 2 wherein the substrate is moved to produce the relative movement.

4. In a method for fabricating a solid state imaging device using a photolithographic technique, the improvement comprising forming a registration pattern array on a substrate on which the device is to be formed by: exposing an image field including an alignment mark on the substrate to produce a registration pattern corresponding to the alignment mark; and aligning a field including an alignment mark with the registration pattern and exposing that field to produce another separate registration pattern.

5. A method as claimed in claim 4 wherein each field contains device structure.

6. A method as claimed in claim 5 wherein a region of each field comprises device structure comprising only part of the active area of a complete device, wherein the regions are aligned by aligning a succeeding field with the registration pattern generated by exposure of a preceding field.

7. A method as claimed in claim 6 wherein each field is heavily exposed in a layer of positive photo-resist on the substrate and alignment is achieved by aligning the succeeding field with the latent image of the preceding field.

8. A method as claimed in claim 7 wherein the succeeding field is moved relative to the substrate by a predetermined distance after alignment before the succeeding field is exposed.

9. A method as claimed in claim 8 wherein the substrate is moved to produce the relative movement.

10. A method as claimed in claim 6 wherein the regions are substantially rectangular in shape having long and short sided and are produced such that a short side of one region adjoins a short side of an adjacent other region.

11. A method as claimed in claim 10 wherein each region has an alignment mark which is located to a side of the region which is substantially orthogonal to the boundary between adjacent regions.

12. A method as claimed in claim 6 wherein the regions are substantially rectangular in shape having long and short sides and are produced such that a long side of one region adjoins a long side of an adjacent other region.

13. A method as claimed in claim 12 wherein each region has an alignment mark which is located to a side of the region which is substantially orthogonal to the boundary between adjacent regions.

14. A method as claimed in claim 6 wherein two alignment marks are included in a field to determine rotational alignment of the substrate and wherein the boundary between adjacent regions is orthogonal to the line joining said two alignment marks.

15. A method as claimed in claim 6 wherein two alignment marks are included in a field to determine rotational alignment of the substrate and wherein the boundary between adjacent regions is parallel to the line joining said two alignment marks.

16. A method as claimed in claim 6 wherein adjoining regions overlap.

17. A method as claimed in claim 6 and including the step of exposing a field on the substrate to produce a region which includes an end portion of the active area.

18. A method as claimed in claim 17 wherein two fields are exposed including two end portions of active areas having a gap between them.

19. A method as claimed in claim 18 including the step of exposing another field on the substrate to form another region which forms a middle portion of the active area.

20. A method as claimed in claim 18 wherein the active area includes two end portions and one or more middle portions located between them.

21. A method as claimed in claim 6 wherein the active area includes a plurality of layers, each layer comprising at least two adjoining regions which are separately fabricated and wherein the boundary between regions in one layer is substantially offset from that in another layer.

22. A method as claimed in claim 6 wherein the boundary between adjoining regions is parallel to the direction of charge transfer through the active area in the complete device.

23. A method for fabricating a solid state imaging device using a photolithographic technique comprising: interatively repeating a method in accordance with claim 4 to generate an array of registration patterns; and using the array of registration patterns to align further image fields including regions comprising device structure and exposing those further image fields.

24. A method as claimed in claim 23 wherein each further image field comprises device structure comprising only part of the active area of a complete device.

25. A method as claimed in claim 24 wherein each image is heavily exposed in a layer of positive photoresist on the substrate and alignment is achieved by aligning the further image fields with the latent image of the array of registration patterns.

26. A method as claimed in claim 23 wherein the further image fields are moved relative to the substrate by a predetermined distance after alignment before they are exposed.

27. A method as claimed in claim 26 wherein the substrate is moved to produce the relative movement.

28. A method as claimed in claim 23 wherein the regions are substantially rectangular in shape having long and short sides and are produced such that a short side of one region adjoins a short side of the other.

29. A method as claimed in claim 28 wherein each region has an alignment mark which is located to a side of the region which is substantially orthogonal to the boundary between adjoining regions.

30. A method as claimed in claim 23 wherein the regions are substantially rectangular in shape having long and short sides and are produced such that a long side of one region adjoins a long side of an adjacent other region.

31. A method as claimed in claim 30 wherein each region has an alignment mark which is located to a side of the region which is substantially orthogonal to the boundary between adjacent regions.

32. A method as claimed in claim 23 wherein two alignment marks are included in a field to determine rotational alignment of the substrate and wherein the boundary between adjacent regions is orthogonal to the line joining said two alignment marks.

33. A method as claimed in claim 23 wherein two alignment marks are included in a field to determine rotational alignment of the substrate, and wherein the boundary between adjacent regions is parallel to the line joining said two alignment marks.

34. A method as claimed in claim 23 wherein adjoining regions overlap.

35. A method as claimed in claim 23 wherein a plurality of first regions are initially fabricated and then a plurality of second regions.

36. A method as claimed in claim 23 and including the step of exposing a field on the substrate to produce a region which includes an end portion of the active area.

37. A method as claimed in claim 36 wherein two fields are exposed including two end portions of active areas having a gap between them.

38. A method as claimed in claim 37 including the step of exposing another field on the substrate to form another region which forms a middle portion of the active area.

39. A method as claimed in claim 37 wherein the active area includes two end portions and at least one middle portions located between them.

40. A method as claimed in claim 23 wherein the active area comprises a plurality of layers, each layer comprising at least two adjoining regions which are separately fabricated, and wherein the boundary between regions in one layer is substantially offset from that in another layer.

41. A method as claimed in claim 23 wherein the boundary between adjoining regions is parallel to the direction of charge transfer through the active area in the complete device.

* * * * *